(12) United States Patent
Satoh et al.

(10) Patent No.: US 9,117,635 B2
(45) Date of Patent: Aug. 25, 2015

(54) ELECTRODE PLATE FOR PLASMA ETCHING AND PLASMA ETCHING APPARATUS

(75) Inventors: Naoyuki Satoh, Nirasaki (JP);
Nobuyuki Nagayama, Nirasaki (JP);
Keiichi Nagakubo, Nirasaki (JP)

(73) Assignee: TOKYO ELECTRON LIMITED (JP)

( * ) Notice: Subject to any disclaimer, the term of this patent is extended or adjusted under 35 U.S.C. 154(b) by 813 days.

(21) Appl. No.: 13/245,194

(22) Filed: Sep. 26, 2011

(65) Prior Publication Data
US 2012/0073753 A1  Mar. 29, 2012

Related U.S. Application Data

(60) Provisional application No. 61/407,650, filed on Oct. 28, 2010.

(30) Foreign Application Priority Data

Sep. 27, 2010  (JP) .................. 2010-215315

(51) Int. Cl.
| | |
|---|---|
| *C23C 16/50* | (2006.01) |
| *C23C 16/503* | (2006.01) |
| *C23C 16/505* | (2006.01) |
| *C23C 16/509* | (2006.01) |
| *C23C 16/455* | (2006.01) |
| *C23F 1/00* | (2006.01) |
| *H01L 21/306* | (2006.01) |
| *H01J 37/32* | (2006.01) |
| *C23C 16/06* | (2006.01) |
| *C23C 16/22* | (2006.01) |

(52) U.S. Cl.
CPC ......... *H01J 37/32449* (2013.01); *C23C 16/455* (2013.01); *C23C 16/45561* (2013.01); *C23C 16/45563* (2013.01); *C23C 16/45565* (2013.01); *C23C 16/505* (2013.01); *C23C 16/509* (2013.01); *H01J 37/3244* (2013.01); *H01J 37/32541* (2013.01)

(58) Field of Classification Search
CPC ............ C23C 16/455; C23C 16/45561; C23C 16/45563; C23C 16/45565; C23C 16/50; C23C 16/505; C23C 16/509
USPC ............. 156/345.43, 345.44, 345.45, 345.51; 118/723 E, 728
See application file for complete search history.

(56) References Cited

U.S. PATENT DOCUMENTS 5,200,016 A * 4/1993 Namose ................... 156/345.25
5,332,464 A * 7/1994 Namose ........................ 438/9
(Continued)

FOREIGN PATENT DOCUMENTS

| JP | 2003-031555 | 1/2003 |
| JP | 2005033167 | 2/2005 |

(Continued)

*Primary Examiner* — Rudy Zervigon
(74) *Attorney, Agent, or Firm* — Cantor Colburn LLP

(57) ABSTRACT

An electrode plate for a plasma etching is formed as a disc shape having a predetermined thickness, a plurality of gas holes penetrating a surface of the electrode plate perpendicularly to the surface are provided on different circumferences of a plurality of concentric circles, the electrode plate is divided in a radial direction of the electrode plate into two or more regions, types of gas holes provided in the two or more regions are different from each other by region.

5 Claims, 12 Drawing Sheets

(56) References Cited

U.S. PATENT DOCUMENTS

| | | | |
|---|---|---|---|
| 5,792,269 A * | 8/1998 | Deacon et al. | 118/715 |
| 6,048,435 A * | 4/2000 | DeOrnellas et al. | 156/345.44 |
| 6,207,007 B1 * | 3/2001 | Segawa et al. | 156/345.26 |
| 6,565,661 B1 * | 5/2003 | Nguyen | 118/715 |
| 7,270,713 B2 * | 9/2007 | Blonigan et al. | 118/715 |
| 7,296,534 B2 * | 11/2007 | Fink | 118/723 E |
| 7,827,931 B2 * | 11/2010 | Matsushima et al. | 118/723 E |
| 7,850,779 B2 * | 12/2010 | Ma et al. | 118/715 |
| 8,161,906 B2 * | 4/2012 | Kadkhodayan et al. | 118/723 E |
| 8,231,798 B2 * | 7/2012 | Okita et al. | 216/58 |
| 8,298,336 B2 * | 10/2012 | Wang et al. | 118/715 |
| 8,313,805 B2 * | 11/2012 | Kadkhodayan et al. | 427/248.1 |
| 8,387,562 B2 * | 3/2013 | Kikuchi et al. | 118/723 E |
| 8,425,682 B2 * | 4/2013 | Wang et al. | 118/715 |
| 8,573,154 B2 * | 11/2013 | Yorozuya | 118/723 R |
| 2003/0209323 A1 * | 11/2003 | Yokogaki | 156/345.34 |
| 2004/0003777 A1 * | 1/2004 | Carpenter et al. | 118/715 |
| 2004/0238123 A1 * | 12/2004 | Becknell et al. | 156/345.33 |
| 2005/0133161 A1 * | 6/2005 | Carpenter et al. | 156/345.34 |
| 2005/0251990 A1 * | 11/2005 | Choi et al. | 29/558 |
| 2005/0255257 A1 * | 11/2005 | Choi et al. | 427/585 |
| 2006/0096540 A1 * | 5/2006 | Choi | 118/724 |
| 2006/0225655 A1 * | 10/2006 | Faguet et al. | 118/723 R |
| 2006/0228889 A1 * | 10/2006 | Edelberg et al. | 438/689 |
| 2006/0236934 A1 * | 10/2006 | Choi et al. | 118/723 R |
| 2006/0288934 A1 * | 12/2006 | Takahashi et al. | 118/715 |
| 2007/0119370 A1 * | 5/2007 | Ma et al. | 118/723 E |
| 2007/0119371 A1 * | 5/2007 | Ma et al. | 118/723 E |
| 2007/0128862 A1 * | 6/2007 | Ma et al. | 438/680 |
| 2007/0128863 A1 * | 6/2007 | Ma et al. | 438/680 |
| 2007/0128864 A1 * | 6/2007 | Ma et al. | 438/680 |
| 2007/0131171 A1 * | 6/2007 | Takatsuki et al. | 118/723 R |
| 2008/0178807 A1 * | 7/2008 | Wang et al. | 118/723 R |
| 2008/0185104 A1 * | 8/2008 | Brcka | 156/345.29 |
| 2008/0268171 A1 * | 10/2008 | Ma et al. | 427/569 |
| 2010/0006031 A1 * | 1/2010 | Choi et al. | 118/723 R |
| 2011/0168094 A1 * | 7/2011 | Yorozuya | 118/723 R |
| 2012/0073753 A1 * | 3/2012 | Satoh et al. | 156/345.33 |
| 2012/0247673 A1 * | 10/2012 | Hayashi et al. | 156/345.33 |
| 2012/0247678 A1 * | 10/2012 | Takahashi et al. | 156/345.44 |

FOREIGN PATENT DOCUMENTS

| | | |
|---|---|---|
| JP | 200860197 | 3/2008 |
| JP | 2009004713 | 1/2009 |

* cited by examiner

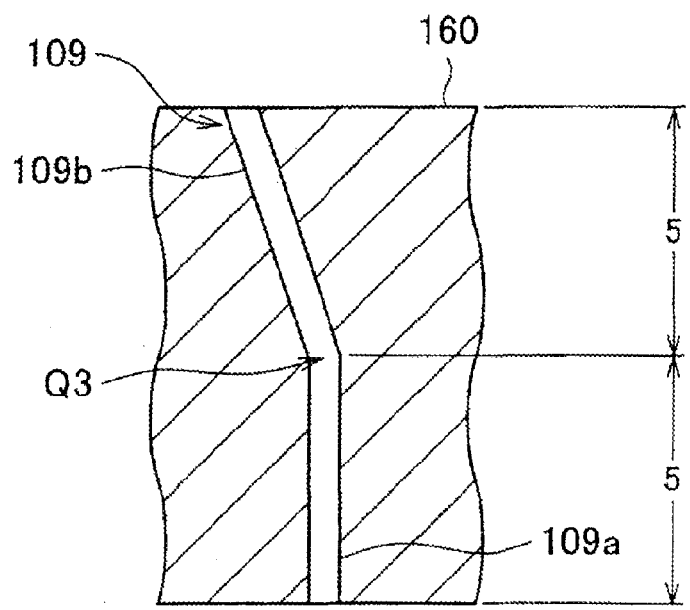

FIG. 4

<TRACE OF DISCHARGE>

STANDARD HOLE
―

| CIRCUM-FEREN-CE / LOCATION | 1 | 2 | 3 | 4 | 5 | 6 | 7 | 8 | 9 | 10 |
|---|---|---|---|---|---|---|---|---|---|---|
| A | ○ | ○ | ○ | ○ | ○ | ○ | ○ | ○ | ○ | ○ |
| B | ○ | ○ | ○ | ○ | ○ | ○ | ○ | ○ | ○ | ○ |
| C | ○ | ○ | ○ | ○ | ○ | ○ | ○ | ○ | ○ | ○ |
| D | ○ | ○ | ○ | ○ | ○ | ○ | ○ | ○ | ○ | ○ |

| CIRCUM-FEREN-CE / LOCATION | 11 | 12 | 13 | 14 | 15 | 16 | 17 | 18 | 19 | 20 | 21 |
|---|---|---|---|---|---|---|---|---|---|---|---|
| A | ○ | ○ | ○ | ○ | ○ | ○ | ○ | ○ | ○ | × | ○ |
| B | ○ | ○ | ○ | ○ | ○ | ○ | ○ | ○ | ○ | × | × |
| C | ○ | ○ | ○ | ○ | ○ | ○ | × | × | × | × | × |
| D | ○ | ○ | ○ | ○ | ○ | × | ○ | × | × | × | × |

<RF 500h>

| TIME \ TYPE OF HOLE | Y-SHAPED HOLE | INCLINED HOLE (7:3) | STRAIGHT HOLE (Φ 0.5mm) |
|---|---|---|---|
| AFTER 500 HOURS | 10% (1/10) | 20% (2/10) | 100% (10/10) |

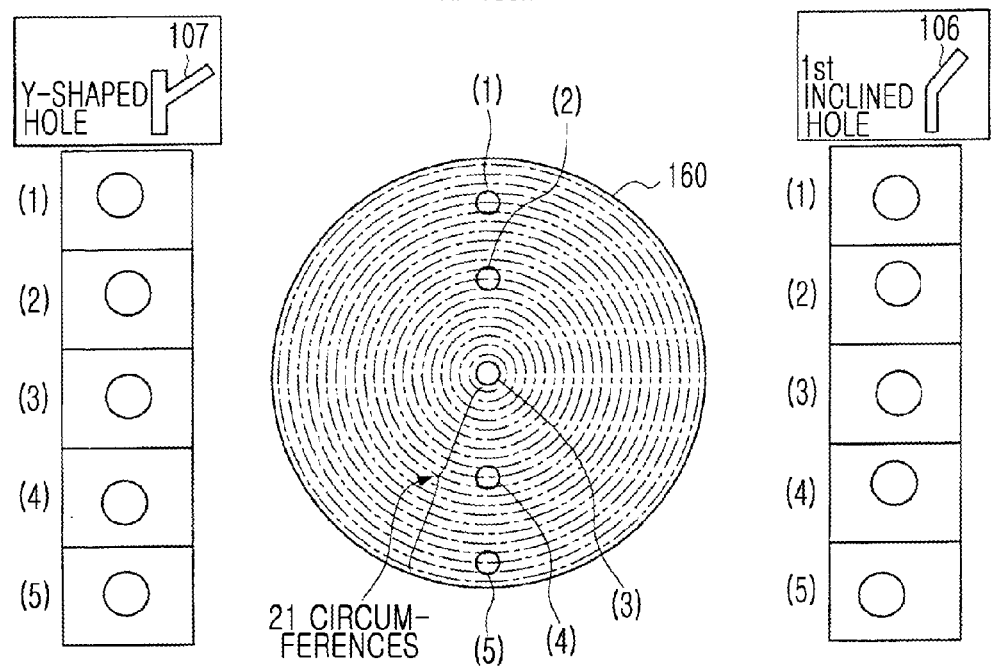

FIG. 10

| | ANTI-DISCHARGE PERFORMANCE | AMOUNT OF ABRASION (WORN AWAY TO BENT PORTION) | COST |
|---|---|---|---|
| STANDARD HOLE | × | ○ | ○ |
| Y-SHAPED HOLE | ○~◎ | × | × |
| INCLINED HOLE(5:5) | ○~◎ | △~○ | △~× |
| INCLINED HOLE(7:3) | ○ | (△~)○ | △ |

FIG. 11

| ARRANGEMENT EXAMPLE \ REGION | INNER CIRCUM-FERENTIAL REGION (1st~15th CIRCUMFERENCES) | INTERMEDIATE REGION (16th~19th CIRCUMFERENCES) | OUTER CIRCUM-FERENTIAL REGION (20th~21st CIRCUMFERENCES) |
|---|---|---|---|
| (1) | INCLINED HOLE(7:3) | Y-SHAPED HOLE OR INCLINED HOLE(5:5) | Y-SHAPED HOLE |
| (2) | INCLINED HOLE(7:3) | INCLINED HOLE(5:5) | Y-SHAPED HOLE OR INCLINED HOLE(5:5) |
| (3) | INCLINED HOLE(5:5) OR INCLINED HOLE(7:3) | INCLINED HOLE(5:5) OR INCLINED HOLE(7:3) | INCLINED HOLE(5:5) |
| (4) | INCLINED HOLE(7:3) OR STANDARD HOLE | INCLINED HOLE(7:3) | INCLINED HOLE(7:3) |
| (5) | STANDARD HOLE | INCLINED HOLE(7:3) OR STANDARD HOLE | INCLINED HOLE(7:3) |

ELECTRODE PLATE FOR PLASMA ETCHING AND PLASMA ETCHING APPARATUS

CROSS-REFERENCE TO RELATED PATENT APPLICATIONS

This application claims the benefits of Japanese Patent Application No. 2010-215315, filed on Sep. 27, 2010 in the Japan Patent Office, and U.S. Patent Application No. 61/407,650, filed on Oct. 28, 2010 in the U.S. Patent and Trademark Office, the disclosures of which are incorporated herein in its entirety by reference.

BACKGROUND OF THE INVENTION

1. Field of the Invention

The present invention relates to an electrode plate for a plasma etching and a plasma etching apparatus, and more particularly, to an arrangement of gas holes in the electrode plate.

2. Description of the Related Art

As an upper electrode of a plasma etching apparatus, an electrode plate (CEL) on a side of a plasma generating space and a cooling plate on an opposite side to the plasma generating space are provided to be adjacent to each other. The electrode plate is a disc-shaped member formed of silicon (Si) to a predetermined thickness, and a plurality of gas holes penetrate through the electrode plate in order to introduce gas into the plasma generating space. Each of the gas holes is a pore, and the gas holes are provided on circumferences of a plurality of concentric circles at regular pitches. Due to the above structure, the electrode plate may function as a shower head for introducing an etching gas into the plasma generating space.

The silicon (Si) forming the electrode plate is worn away by the plasma. Generally, when the electrode plate is used for hundreds of hours, inner portions of the gas holes are worn away by the plasma, and thus, the gas holes are widened toward the plasma generating space similar to trumpet shapes. When the gas holes are widened, etching rates at a center portion and at an edge portion of the electrode plate become uneven, and thus, process characteristics are changed. In addition, the plasma is likely to be introduced into the gas holes. Ions or electrons in the plasma introduced into the gas holes proceed against a flow of the gas in the gas holes, and excite gas in a gap between the electrode plate and the cooling plate. Accordingly, abnormal discharge generates between the electrode plate and the cooling plate, or at a ceiling surface of a process chamber. The abnormal discharge may damage the electrode plate or the cooling plate, may become a source of particles, or may damage an Alumite film that covers a surface of the electrode plate or the cooling plate, and accordingly, an interior of a chamber is contaminated.

For example, Patent Reference 1 discloses a technology of providing magnets that generate a point cusp magnetic field on a surface side of the electrode plate opposite to the other surface of the electrode plate facing a substrate held by a holding stage, and positioning the gas holes so that locations of the gas holes and the magnets in the electrode plate are not in line with each other and thus, the gas holes may be provided at locations where the magnetic field becomes zero, to address a problem that diameters of the gas holes are increased due to the plasma. According to this structure, the gas holes may be provided in portions where a plasma density is low, and thus, the gas holes may not be exposed to highly concentrated plasma. Accordingly, generation of an abnormal discharge on a rear surface of the upper electrode may be prevented.

In Patent Reference 1, four magnets including two N-poles and two S-poles are disposed so that the N-poles and the S-poles generating a point cusp magnetic field are alternately disposed, and the gas holes are provided in a zero-magnetic field portion that is generated at a center of the four magnets. However, the gas holes may not be stably provided at the portion of zero-magnetic field. Therefore, according to Patent Reference 1, the abnormal discharge generating on the rear surface of the upper electrode may not be completely prevented.

3. Prior Art Reference (Patent Reference 1) Japanese Patent Laid-open Publication No. 2003-31555

SUMMARY OF THE INVENTION

The present invention provides an electrode plate for a plasma etching and a plasma etching apparatus capable of preventing an abnormal discharge from generating on a rear surface of an upper electrode.

According to an aspect of the present invention, there is provided an electrode plate for a plasma etching formed as a disc shape having a predetermined thickness, the electrode plate including: a plurality of gas holes penetrating a surface of the electrode plate perpendicularly to the surface, and provided on different circumferences of a plurality of concentric circles, wherein the electrode plate is divided in a radial direction of the electrode plate into two or more regions, types of gas holes provided in the two or more regions are different from each other by region, and the types of gas holes include bent type gas holes.

According to the above structure, in a disc-shaped electrode plate, different types of gas holes are provided in two or more regions into which the electrode plate is divided in the radial direction of the electrode plate. The different types of gas holes may include bent type gas holes. Because it is difficult for the plasma to be introduced in the bent type gas holes, an abnormal discharge generating on a rear surface of an upper electrode may be prevented. For example, in the plasma etching apparatus, it is difficult to exhaust gas on an outer circumferential side of the electrode plate, and thus, the discharge is likely to generate at the outer circumferential portion of the electrode plate. Considering this, gas holes provided on the outer circumferential side are provided as bent type gas holes, in which the plasma is less likely to be introduced than the gas holes provided on the inner circumferential side, and thus, the abnormal discharge may be prevented. In addition, different types of gas holes are provided in the electrode plate, and thus, the arrangement of the plurality of types of gas holes may be optimized according to a shape or size of the plasma etching apparatus adopting the electrode plate, and process conditions, when comparing with the conventional electrode plate in which standard gas holes having a straight shape are provided uniformly in the same electrode plate.

The gas holes provided in a region including at least the outermost circumference from among the two or more regions may be the bent type gas holes.

Each bent type gas hole may include: a straight pore penetrating the surface of the electrode plate perpendicularly to the surface; and a sloping pore communicating with the straight pore in the electrode plate, and penetrating the other surface of the electrode plate non-perpendicularly to the other surface.

The bent type gas hole may be at least one of an inclined hole including the straight pore and the sloping pore, and a Y-shaped hole including the straight pore, the sloping pore, and a trap pore forming a path branching from a connecting point between the straight pore and the sloping pore.

Each type of gas holes may be provided in the corresponding region based on a first arrangement rule, in which a region where the Y-shaped holes are provided is located on an outer circumferential side of a region where the inclined holes are provided, and the region where the inclined holes are provided may be located on an outer circumferential side of a region where standard holes penetrating the electrode plate straight in a thicknesswise direction of the electrode plate are provided.

The inclined holes may include first inclined holes and second inclined holes having a ratio between lengths of the straight pore and the sloping pore, which is less than a ratio of the first inclined holes, and each type of gas holes may be provided in the corresponding region based on a second arrangement rule, in which a region where the first inclined holes are provided is located on an inner circumferential side of a region where the second inclined holes are provided.

The electrode plate may be divided into three regions on an inner circumferential side, an outer circumferential side, and an intermediate side between the inner circumferential side and the outer circumferential side in the radial direction of the electrode plate, and the gas holes corresponding to the first and second arrangement rules from among the Y-shaped holes, the first inclined holes, the second inclined holes, and the standard holes may be provided as the gas holes on the inner circumferential side, the gas holes on the outer circumferential side, and the gas holes on the intermediate side.

The types of a plurality of gas holes provided in each of the three regions may be the same as each other.

The types of a plurality of gas holes provided in two adjacent regions among the three regions may be the same as each other.

The Y-shaped holes, the first inclined holes, and the second inclined holes may be communicated with gas holes provided in a cooling plate that is adjacent to the electrode plate.

According to another aspect of the present invention, there is provided an electrode plate for a plasma etching formed as a disc shape having a predetermined thickness, the electrode plate including: a plurality of gas holes penetrating a surface of the electrode plate perpendicularly to the surface, and provided on different circumferences of a plurality of concentric circles, wherein the electrode plate is divided in a radial direction of the electrode plate into two or more regions, and the gas holes provided in each of the two or more regions are bent type gas holes of the same type. According to this structure, it is difficult for the plasma to be introduced into the bent type gas holes, and thus, an abnormal discharge generating on a rear surface of the upper electrode may be prevented.

According to another aspect of the present invention, there is provided a plasma etching apparatus including: a process chamber; a first electrode and a second electrode facing each other in the process chamber and having a plasma generating space between the first and second electrodes; and a gas supply source which supplies a gas into the process chamber, wherein the first electrode may include an electrode plate formed as a disc shape having a predetermined thickness, a plurality of gas holes penetrating a surface of the electrode plate perpendicularly to the surface are provided on different circumferences of a plurality of concentric circles, the electrode plate is divided in a radial direction of the electrode plate into two or more regions, types of gas holes provided in the two or more regions are different from each other by region, and the types of gas holes may include bent type gas holes. According to this structure, it is difficult for the plasma to be introduced into the bent type gas holes, and thus, an abnormal discharge generating on a rear surface of the upper electrode may be prevented.

According to another aspect of the present invention, there is provided a plasma etching apparatus including: a process chamber; a first electrode and a second electrode facing each other in the process chamber and having a plasma generating space between the first and second electrodes; and a gas supply source which supplies a gas into the process chamber, wherein the first electrode may include an electrode plate formed as a disc shape having a predetermined thickness, a plurality of gas holes penetrating a surface of the electrode plate perpendicularly to the surface are provided on different circumferences of a plurality of concentric circles, the electrode plate is divided in a radial direction of the electrode plate into two or more regions, and the gas holes provided in each of the two or more regions are bent type gas holes of the same type. According to this structure, it is difficult for the plasma to be introduced into the bent type gas holes, and thus, an abnormal discharge generating on a rear surface of the upper electrode may be prevented.

The first electrode may be an upper electrode.

BRIEF DESCRIPTION OF THE DRAWINGS

The above and other features and advantages of the present invention will become more apparent by describing in detail exemplary embodiments thereof with reference to the attached drawings in which:

FIGS. 2A through 2C are diagrams showing a plurality of types of gas holes according to an embodiment of the present invention;

FIG. 4 is a table showing experimental results of observing locations and existence of traces of discharge;

FIG. 6 is a table showing experimental results in relation to types of gas holes and existence of the traces of discharge;

FIG. 10 is a table comparing characteristics of types of gas holes; and

FIG. 11 is a table showing examples of arranging a plurality of types of gas holes.

DETAILED DESCRIPTION OF THE INVENTION

Figure 1:
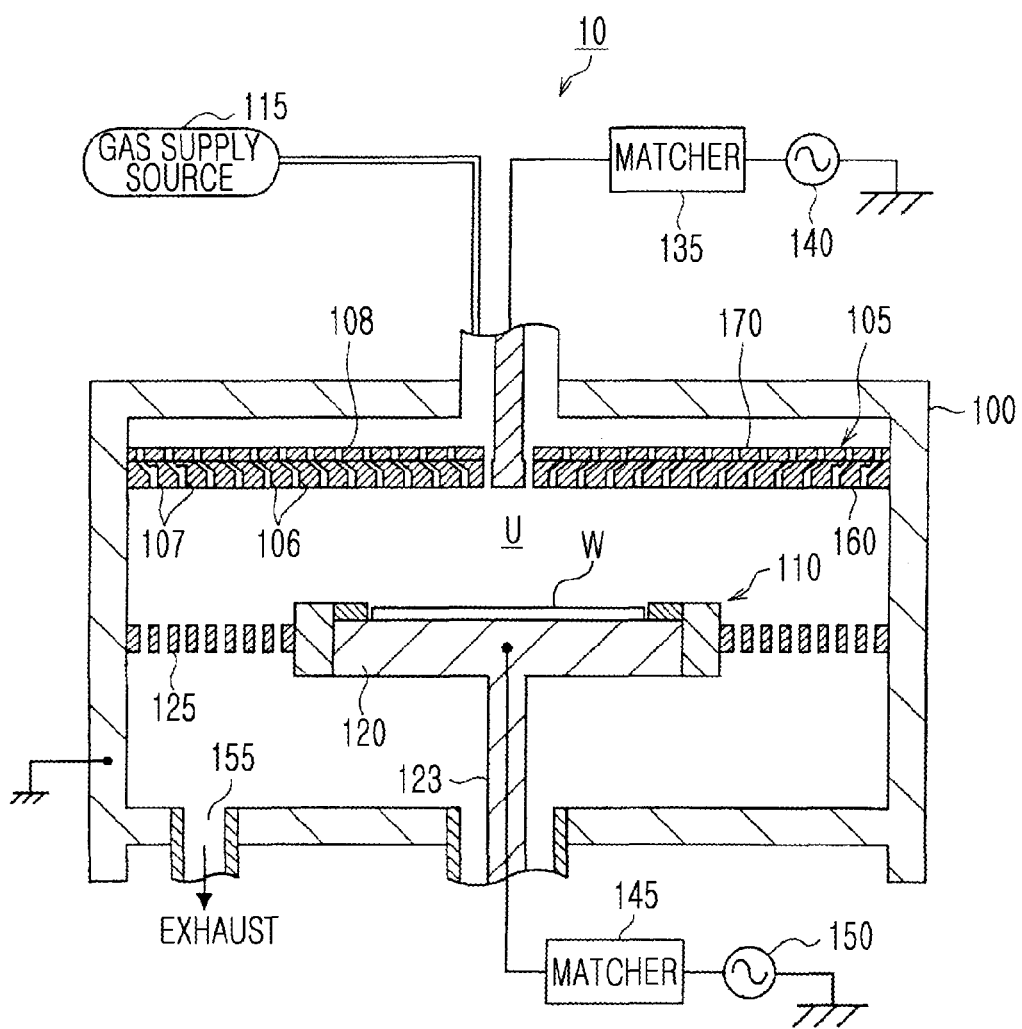
FIG. 1 is a block diagram of a plasma etching apparatus according to an embodiment of the present invention.

Hereinafter, the present invention will be described in detail by explaining exemplary embodiments of the invention with reference to the attached drawings. Also, in the specification and the drawings, elements having substantially the same functions and configurations are denoted by the same reference numerals and thus a repeated explanation thereof will not be given.

(Structure of a Plasma Etching Apparatus)

First, a schematic structure of a plasma etching apparatus according to an embodiment of the present invention will be described with reference to FIG. 1. FIG. 1 is a schematic longitudinal-sectional view of a capacity-coupled (parallel plates) plasma etching apparatus according to an embodiment of the present invention.

A plasma etching apparatus 10 includes a process chamber 100 in which an etching process is performed on a wafer W. The process chamber 100 has a cylindrical shape, and is grounded. The process chamber 100 may be formed of a member that is formed by thermally spraying an insulating material on an aluminum base material, or a member formed by coating ceramic on a silicon or aluminum base material.

In the process chamber 100, an upper electrode 105 and a lower electrode 110 are disposed to face each other. Accordingly, a pair of parallel-plates electrodes is configured, and a plasma generating space U is formed between the pair of parallel-plates electrodes. An electrode plate 160 is provided on a side of the upper electrode 105, which faces the plasma generating space U, and a cooling plate 170 is provided on a side opposite to the plasma generating space U. The electrode plate 160 and the cooling plate 170 are disc-shaped members having a predetermined thickness, and are disposed adjacent to each other.

The electrode plate 160 is formed of a conductive material such as silicon or aluminum. The electrode plate 160 includes a plurality of first inclined holes 106 and a plurality of Y-shaped holes 107. The first inclined holes 106 and the Y-shaped holes 107 penetrate through the electrode plate 160 in a thicknesswise direction of the electrode plate 160 while bending.

The first inclined holes 106 and the Y-shaped holes 107 penetrate through the electrode plate 160 perpendicularly to the surface of the electrode plate 160, which faces the plasma generating space U. On the other hand, the first inclined holes 106 and the Y-shaped holes 107 penetrate through the electrode plate 160 non-perpendicularly to the other surface of the electrode plate 160, which is opposite to the plasma generating space U. Types, arrangements, operations, and effects of gas holes will be described later.

The cooling plate 170 is formed of a conductive material such as aluminum or silicon having a high thermal conductivity so as to cool down heat of the plasma transferred to the electrode plate 160. In the present embodiment, surfaces of the electrode plate 160 and the cooling plate 170 are protected by an aluminum anodizing process (Alumite film) from the plasma. Alumina or Yttria may be thermally sprayed on the surfaces of the electrode plate 160 and the cooling plate 170.

Gas holes 108 penetrate through the cooling plate 170 straight in the thicknesswise direction of the cooling plate 170, and the gas holes 108 are communicated with upper openings of the bent holes such as the first inclined holes 106 and the Y-shaped holes 107 in the electrode plate 160. According to this structure, an etching gas is supplied from a gas supply source 115 and introduced into the plasma generating space U from the first inclined holes 106 and the Y-shaped holes 107 in the electrode plate 160 via the gas holes 108 of the cooling plate 170.

A holding stage 120 on which the wafer W is placed is provided as the lower electrode 110. The holding stage 120 is formed of metal such as aluminum, and is supported by a supporting member 123 via an insulating substance (not shown). Accordingly, the lower electrode 110 is in an electrically floating state. A baffle plate 125 having pores is provided around an outer circumference of the holding stage 120 so as to control a flow of the gas. The baffle plate 125 is grounded.

A radio frequency (RF) power source 140 is connected to the upper electrode 105 via a matcher 135 so that RF of a desired frequency may be applied to the upper electrode 105. An RF power source 150 is also connected to the lower electrode 110 via a matcher 145 so that RF of a desired frequency may be applied to the lower electrode 110.

The etching gas supplied from the gas supply source 115 is excited by electric field energy of the RF outputted from the RF power sources 140 and 150, and accordingly, plasma is generated in the plasma generating space U. The wafer W is etched by the generated plasma. In addition, the plasma generating space U is surrounded by inner walls of the process chamber 100, the baffle plate 125, and the holding stage 120.

An exhaust port 155 is provided in a bottom surface of the process chamber 100, and inside of the process chamber 100 is evacuated by an exhauster (not shown) connected to the exhaust port 155 so as to maintain a desired vacuum state in the process chamber 100.

(Types of Gas Holes)

In the present embodiment, types of the gas holes that may be provided in the electrode plate 160 may include a standard hole, a Y-shaped hole, and an inclined hole. The Y-shaped hole and the inclined hole are examples of bent holes. Examples of the inclined hole may include the first inclined hole that is described above, and a second inclined hole or the like. The standard hole is a general hole (straight hole) that penetrates the electrode plate 160 straight in the thicknesswise direction of the electrode plate 160.

Figure 2A:
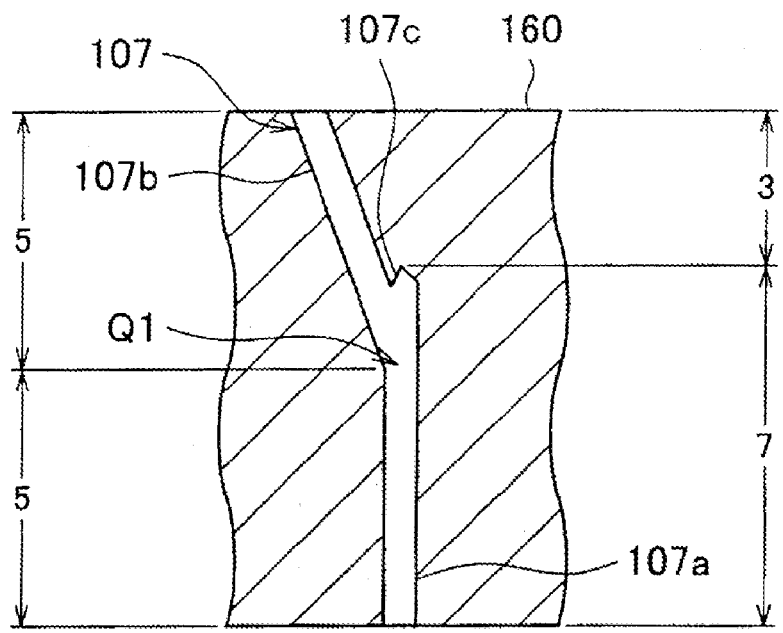
Figure 2B:
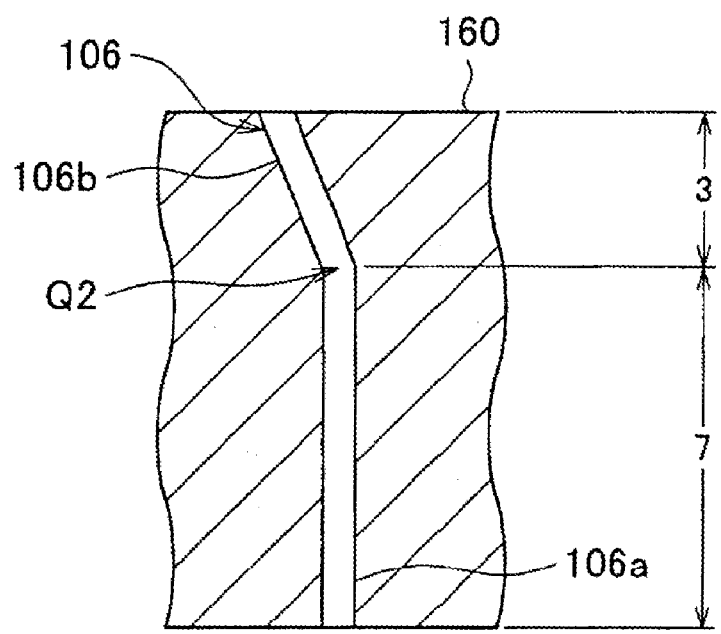

Types of the bent holes will be described as follows. As shown in FIG. 2A, the Y-shaped hole 107 includes a straight pore 107a, a sloping pore 107b, and a trap pore 107c. The straight pore 107a penetrates the surface of the electrode plate 160, which faces the plasma generating space U (gas outlet side), perpendicularly to the surface. The sloping pore 107b communicates with the straight pore 107a in the electrode plate 160, and penetrates the other surface of the electrode plate 160, which is opposite to the plasma generating space U (gas inlet side), obliquely (non-perpendicularly) to the other surface. The trap pore 107c is branched from a connecting point Q1 between the straight pore 107a and the sloping pore 107b to form a path extending from the straight pore 107a. A ratio between a length from a lower surface of the electrode plate 160 to a leading edge of the trap pore 107c and a length in a heightwise direction from the leading edge of the trap pore 107c to an upper surface of the electrode late 160 is 7:3. A ratio between a length of the straight pore 107a from the lower surface of the electrode plate 160 to the connecting point Q1 and a length in a heightwise direction of the sloping pore 107b from the connecting point Q1 to the upper surface of the electrode plate 160 is 5:5. In the present embodiment, a thickness of the electrode plate 160 is 10 mm. Also, the straight pore 107a is provided by drilling the electrode plate 160 by using a drill, and the sloping pore 107b is provided by using a laser.

The first inclined hole 106 includes a straight pore 106a and a sloping pore 106b. The straight pore 106a and the sloping pore 106b are the same configurations as the straight pore 107a and the sloping pore 107b. A ratio between a length of the straight pore 106a from the lower surface of the electrode plate 160 to a connecting point Q2 and a length in a heightwise direction of the sloping pore 106b from the connecting point Q2 to the upper surface of the electrode plate

160 is 7:3. The straight pore 106*a* and the sloping pore 106*b* may be provided in the same way as the straight pore 107*a* and the sloping pore 107*b*.

A second inclined hole 109 has the same structure as that of the first inclined hole 106 except that a ratio in a heightwise direction between a straight pore 109*a* and a sloping pore 109*b* is 5:5. The first inclined hole 106 and the second inclined hole 109 are examples of the inclined hole, as described above. In addition, the ratio of lengths in a heightwise direction between the straight pore 109*a* and the sloping pore 109*b* is not limited to the above examples, and may vary within a processable range.

In addition, referring to FIG. 1, the sloping pores 106*b* and 107*b* of the first inclined hole 106 and the Y-shaped hole 107 are inclined toward an outer circumference; however, the present invention is not limited thereto, that is, the sloping pores 106*b* and 107*b* may be inclined toward an inner circumference. However, the sloping pores need to be inclined in the same directions as each other. In the present embodiment, the sloping pores are inclined in a tangential direction. In addition, a diameter of each of the gas holes is φ0.5 mm.

(Arrangement of the Gas Holes)

Figure 3:
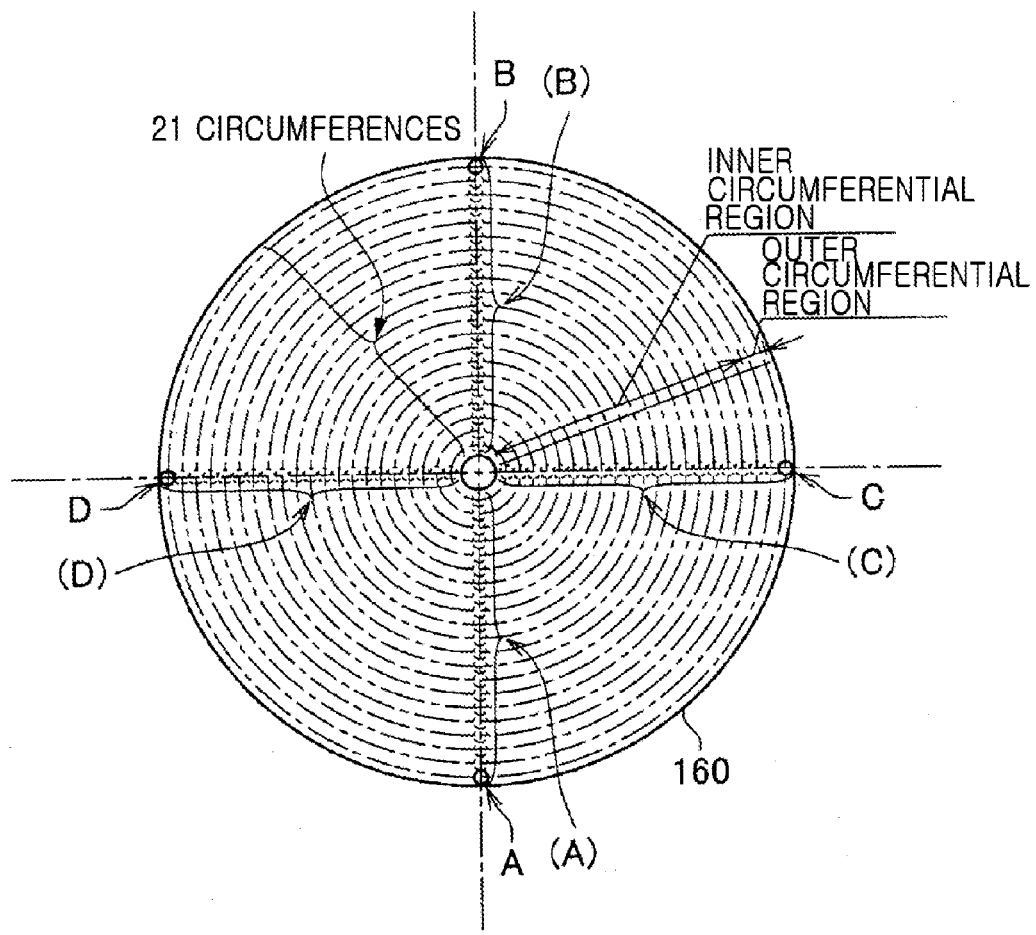
FIG. 3 is a diagram showing locations of traces of discharge, which were formed during experiments, on a plate surface of an electrode plate according to an embodiment of the present invention.

Next, an arrangement of the gas holes will be described. In general, in the plasma etching apparatus 10, an outer circumferential side of a plate surface in the electrode plate 160 is adjacent to an inner wall of the process chamber 100, and thus, it is difficult to exhaust the gas. Therefore, the outer circumferential side of the plate surface in the electrode plate 160 is more likely to be discharged than an inner circumferential side thereof. As shown in FIG. 3, in the electrode plate 160, standard holes are provided on different circumferences of a plurality of concentric circles, for example, 21 concentric circles (not shown) at regular pitches. FIG. 4 shows experimental results in relation to traces of discharge that are generated by the etching process, in a case where the standard holes are provided on the circumferences of the 21 concentric circles.

Experimental conditions were as follows.
Pressure inside the process chamber 100: 25 mTorr
RF power outputted from the RF power source 140: 3300 W
RF power outputted from the RF power source 150: 3800 W
Applying time of the RF power: 250 h
Type of gases and flow rate: $C_5F_8$/Ar/$O_2$=30/750/50 sccm Traces of discharge of the plate surface on an upper portion of the electrode plate 160 were observed. Observing locations A, B, C, and D of FIG. 4 denote intersection points between center lines crossing locations A, B, C, and D of FIG. 3 and corresponding circumferences. As a result of observing with the naked eye whether the traces of discharge remain on the observing locations A, B, C, and D on each of the circumferences, a mark "o" of FIG. 4 denotes that there is no trace of discharge or a small trace of discharge, and a mark "x" thereof denotes that there is a large trace of discharge. Then, the large traces of discharge may be observed with the naked eye on a 16th circumference or more outer circumferences than the 16th circumference, and in particular, the large traces of discharge are shown in the nearly entire regions of two circumferences (20th and 21st circumferences) from the outermost circumference.

Next, in electrode plate 160, a case where a plurality of types of gas holes are provided on different circumferences of a plurality of concentric circles at regular pitches will be described. In the present embodiment, a plurality of gas holes (not shown) are provided on each of the circumferences of 21 concentric circles, as shown in FIG. 3. According to the present embodiment, the electrode plate 160 is divided into two regions, that is, an outer circumferential region and an inner circumferential region, in a radial direction, and different types of gas holes are provided in the two regions, respectively. The gas holes in each of the regions are the same type as each other. In more detail, a plurality of Y-shaped holes 107 are provided on two circumferences included in the outer circumferential region, that is, the outermost circumference (21st circumference) and the circumference located on an inner side of the outermost circumference (20th circumference), at regular pitches. In addition, a plurality of first inclined holes 106 are provided on each of the remaining 19 circumferences that are included in the inner circumferential region, at regular pitches.

As described above, according to the present embodiment, the plate surface of the electrode plate 160 is divided into two regions, that is, the outer circumferential region and the inner circumferential region, and the different types of gas holes are provided in the outer and inner circumferential regions, respectively. However, the present invention is not limited thereto, that is, the plate surface of the electrode plate 160 may be divided into three or more regions. In addition, according to the present embodiment, different types of bent holes are provided in both the outer circumferential region and the inner circumferential region, respectively; however, the arrangement of the gas holes is not limited thereto. However, the gas holes provided in the region including at least the outermost circumference, among the two or more regions, have to be the bent holes. For example, in the plasma etching apparatus 10, it is difficult to exhaust the gas on the outer circumferential side of the electrode plate 160, and thus, the outer circumferential side is likely to be discharged. Considering this, the gas holes of bent type, in which it is more difficult for the plasma to introduce than the gas holes provided on the inner circumferential side, are provided on the outer circumferential side, and thus, an abnormal discharge may be effectively prevented. In addition, an optimal arrangement of the plurality of types of gas holes will be described later.

In consideration of the above results, in the electrode plate 160 according to the present embodiment, the gas holes provided on the two circumferences (20th and 21st circumferences) from the outermost circumference are the bent holes so that it is more difficult for the plasma to introduce into the bent holes than the gas holes provided on the other circumferences located inside the outer two circumferences, and accordingly, an abnormal discharge may be prevented. As described above, according to the electrode plate 160 of the present embodiment, the type of gas holes provided in each of the regions divided in the radial direction of the electrode plate 160 is changed based on the shape or size of the plasma etching apparatus 10, and thus, the arrangement of the types of the gas holes may be optimized.

(Relation Between the Type of the Gas Hole and the Discharge)

Figures 5A, 5B:
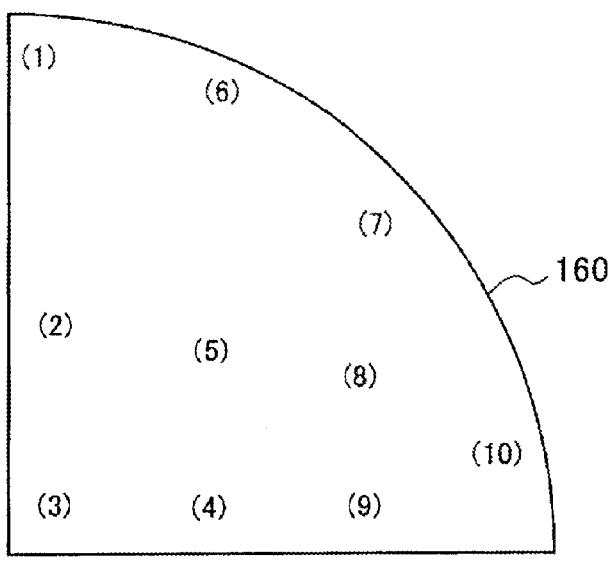
FIGS. 5A and 5B are a diagram and a table showing experimental results in relation to abrasion degrees of a plurality of types of gas holes according to an embodiment of the present invention.

Before describing the optimization of the gas hole arrangement, a relation between the type of the gas hole including the above described bent hole and the discharge will be described as follows. As shown in FIG. 5A, the electrode plate 160 was divided into four regions, an experiment was performed by checking with the naked eye whether there is a trace of discharge in each of locations (1) through (10) on the plate surface. Experimental conditions were the same as the discharge experiment using the standard holes as shown in FIG. 4 except that the applying time of the RF power was 500 h, which is twice that of the above experiment using the standard holes.

Experimental results are shown in FIG. 5B. When the gas holes were the standard holes (ϕ0.5 mm), there were traces of discharge in all of the locations (1) through (10). Therefore, in a case of the standard hole, a discharge rate was 100%. On the other hand, when the gas holes were Y-shaped holes 107, there was one trace of discharge on only the location (1) among the locations (1) through (10). Therefore, in a case of the Y-shaped hole 107, the discharge rate was 10%. When the gas holes were the first inclined holes 106 (7:3), there were traces of discharge on the two locations (1) and (8) among the locations (1) through (10). Therefore, in a case of the first inclined hole 106 (7:3), the discharge rate was 20%. Thus, it was proved that it is more difficult to generate a discharge in the bent holes than the standard holes.

Figure 7:
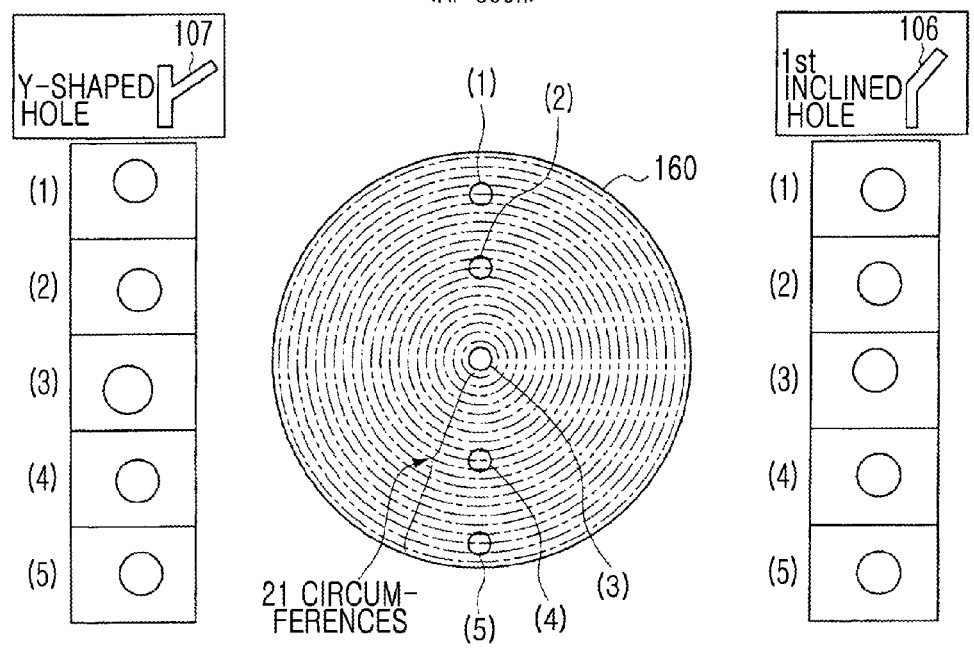
FIG. 7 is a table showing experimental results in relation to types of gas holes and existence of the traces of discharge.
Figure 8:
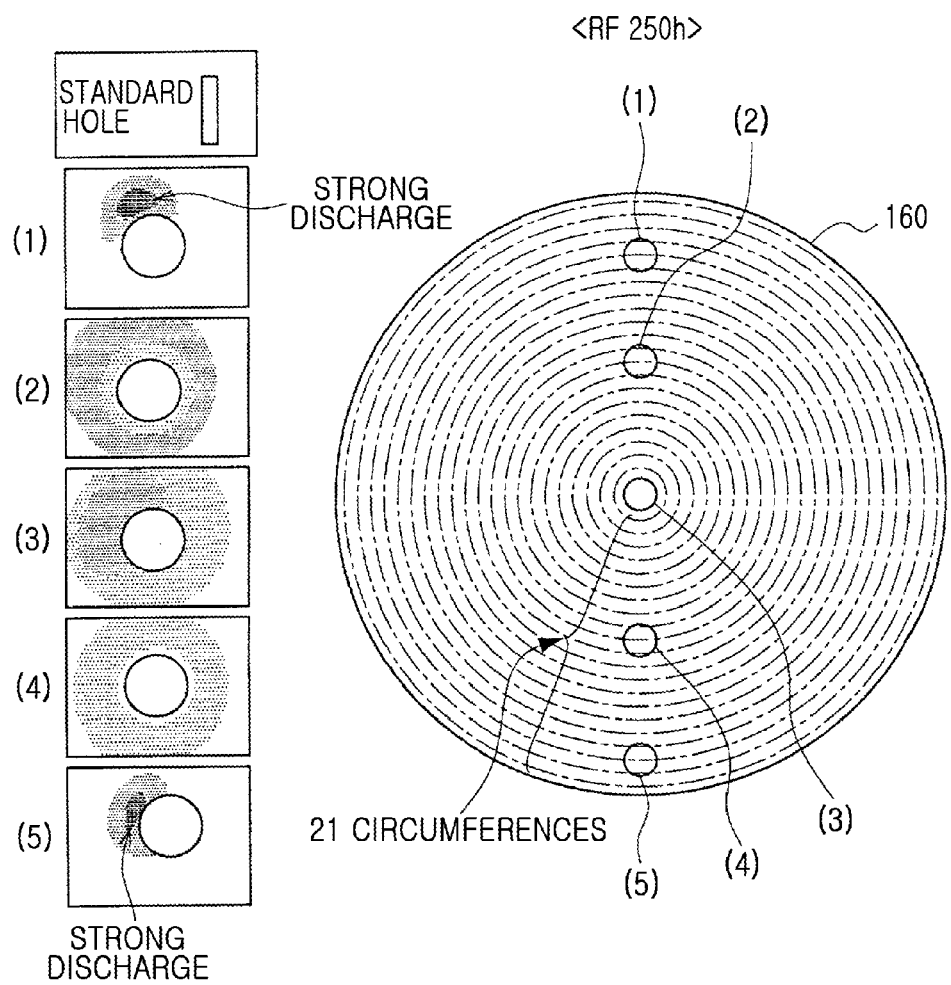
FIG. 8 is a table showing experimental results in relation to types of gas holes and existence of the traces of discharge.

When the applying time of the RF power was changed, the same discharge tendency was shown in both the bent holes and the standard holes. FIG. 6 shows results of observing the traces of discharge in the bent holes with the naked eye when the applying time of the RF power was 150 hours, and FIG. 7 shows results of observing the traces of discharge in the bent holes with the naked eye when the applying time of the RF power was 300 hours. On the other hand, FIG. 8 shows results of observing the traces of discharge in the standard holes with the naked eye when the applying time of the RF power was 250 hours. As shown in FIGS. 6 and 7, in both cases of the first inclined holes 106 and the Y-shaped holes 107 as the bent holes, there was no trace of discharge in locations (1) through (5) on the plate surface of the electrode plate 160. On the other hand, as shown in FIG. 8, in a case of the standard holes, there were traces of discharge in the locations (1) through (5) on the plate surface of the electrode plate 160, and in particular, large traces of discharge are shown in the locations (1) and (5).

Since the electrode plate 160 is provided on an upper portion of the plasma generating space U and exposed to the plasma, it is likely to be affected by the plasma. Therefore, the silicon (Si) forming the electrode plate 160 is worn away by the plasma during performing of the processes. In a case of the standard holes (refer to FIG. 9A), when the electrode plate 160 is used for hundreds of hours, inner portions of the gas holes are typically worn away by the plasma, and the gas holes are widened to have shapes similar to trumpets toward the plasma generating space U (refer to FIG. 9B). When the gas holes are widened as described above, process characteristics are changed from those before the inner portions of the gas holes are worn away, and thus, the electrode plate 160 needs to be replaced with a new electrode plate 160.

Figure 9:
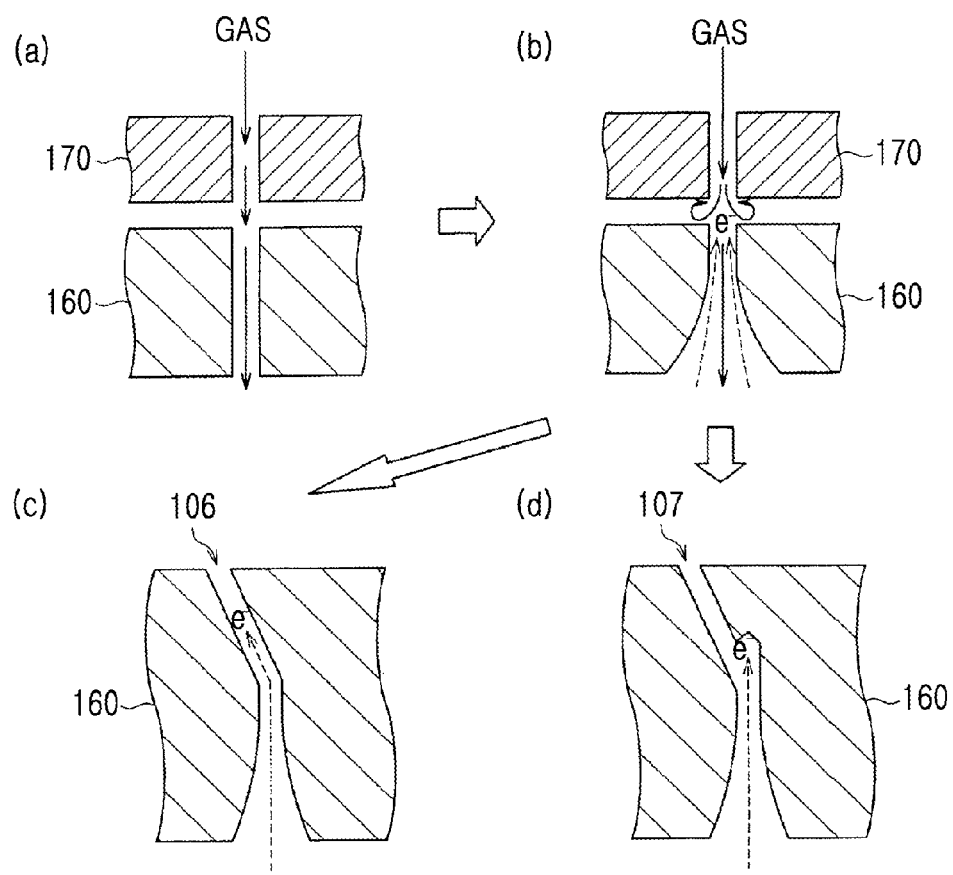
FIG. 9 is a diagram illustrating relations between types of gas holes and a discharge phenomenon.

When the gas holes in the electrode plate 160 are widened to have shapes similar to trumpets, ions or electrons in the plasma are introduced into the gas holes. The ions or electrons introduced into the gas holes proceed against a flow of gas in the gas holes, and excite gas in a gap between the electrode plate 160 and the cooling plate 170, as shown in FIG. 9B. Accordingly, an abnormal discharge generates between the electrode plate 160 and the cooling plate 170. When the electrons further proceed into the gas holes provided in the cooling plate 170 against the flow of gas, an abnormal discharge may generate on an upper surface of the cooling plate 170 or on a ceiling surface of the process chamber 100. The abnormal discharge may damage the electrode plate 160 or the cooling plate 170, may become a source of particles, or may damage the Alumite film covering the surface of the electrode plate 160 or the cooling plate 170, and thus, inside of the process chamber 100 may be contaminated.

Therefore, in the electrode plate 160 of the present embodiment, the gas holes such as the first inclined holes 106 or the Y-shaped holes 107 are provided (refer to FIGS. 9C and 9D). According to the present embodiment, since the gas holes are bent therein, charged particles in the plasma that is introduced into the gas holes may be likely to collide with walls and then may be extinguished. Accordingly, the plasma may be restrained from proceeding to the upper portion of the electrode plate 160. Therefore, the abnormal discharge may be prevented.

In particular, in a case of the Y-shaped hole 107 shown in FIG. 9D, since the trap pore 107c is provided at a bent portion, the charged particles may be easily trapped in a space of the trap pore 107c. Therefore, when the Y-shaped hole 107 is compared with the first inclined hole 106 shown in FIG. 9C, the charged particles may be trapped more easily. Thus, when the gas holes are the Y-shaped holes 107, the abnormal discharge may be prevented more effectively than the first inclined holes 106.

Based on the above described experimental results and the principles of the bent holes, the bent holes are disposed in regions where the discharge may easily generate in the plate surface of the electrode plate 160 according to the present embodiment. For example, in the electrode plate 160 of the present embodiment, the bent holes are arranged on the two circumferences from the outermost circumference on which the discharge is likely to generate most easily. However, although the Y-shaped holes 107 are provided in the regions of the two circumferences from the outermost circumference in the present embodiment, the present invention is not limited thereto, that is, the first inclined holes 106 or the second inclined holes 109 may be provided. In addition, the first inclined holes 106 are provided on the 19 circumferences from the innermost circumference in the present embodiment; however, the second inclined holes 109 or the standard holes may be provided.

(Characteristics of the Types of Gas Holes)

In order to optimize the arrangement of the various types of the above-described bent holes according to an objective, it is advantageous to know characteristics of the types of gas holes shown in FIG. 10. For example, in view of anti-discharge performance, the standard hole is the worst, and the anti-discharge performance improves in an order of the first inclined hole 106 (7:3), the second inclined hole 109 (5:5), and the Y-shaped hole 107.

In the first inclined hole 106 (7:3) and the second inclined hole 109 (5:5), the inclined portion of the second inclined hole 109 (5:5) is longer than that of the first inclined hole 106 (7:3), and thus, the electrons in the plasma introduced into the gas hole are easily extinguished by colliding with the wall. Therefore, the discharge is less likely to generate in the second inclined hole 109 (5:5) than the first inclined hole 106 (7:3).

In view of the fabrication costs, the Y-shaped hole 107 is the worst, and the fabrication costs are reduced in an order of the Y-shaped hole 107, the second inclined hole 109 (5:5), the first inclined hole 106 (7:3), and the standard hole. Since the Y-shaped hole 107 has the most complex structure and the inclined holes 106 and 109 have the next most complex structures, it takes a long time to perform a machining process.

(Optimization of Gas Hole Arrangement)

Based on the characteristics of the types of gas holes described above, FIG. 11 shows examples of optimizing the arrangements of the bent holes of various structures and the standard holes according to the objectives. Examples (1) through (5) of FIG. 11 are optimal arrangement examples when the circumferences of the 21 concentric circles on the electrode plate 160 are divided into three regions, that is, an inner circumferential side, an outer circumferential side, and an intermediate side in a radial direction of the electrode plate 160. The inner circumferential region includes 1st through 15th circumferences, the outer circumferential region includes 20th and 21st circumferences, and the intermediate region includes 16th through 19th circumferences. The inner circumferential region occupies an area of 0% to 75% of the 1st through 21st circumferences disposed in the radial direction of the plate surface of the electrode plate 160. The intermediate region occupies an area of 75% to 95% of the 1st through 21st circumferences disposed in the radial direction of the plate surface of the electrode plate 160. The outer circumferential region occupies an area of 95% to 100% of the 1st through 21st circumferences disposed in the radial direction of the plate surface of the electrode plate 160.

Arrangement Example (1)

Arrangement Example Focusing on a Discharge Countermeasure

For example, the arrangement example (1) focuses on the discharge countermeasure. In the arrangement example (1), the first inclined holes 106 (7:3) are provided in the inner circumferential region, the Y-shaped holes 107 or the second inclined holes 109 (5:5) are provided in the intermediate region, and the Y-shaped holes 107 are provided in the outer circumferential region.

In the arrangement example (1), the bent holes are provided in all of the regions, and thus, the abnormal discharge may be prevented throughout the entire plate surface of the electrode plate 160. In addition, the Y-shaped holes 107 or the second inclined holes 109 (5:5) are provided in the intermediate region and the outer circumferential region where the abnormal discharge is likely to generate, and in particular, the Y-shaped holes 107 are provided in the outer circumferential region on which the abnormal discharge is more likely to generate, and thus, the abnormal discharge may be completely prevented. In addition, the first inclined holes 106 (7:3) that are stronger against abrasion and have a longer lifespan than the Y-shaped holes 107 or the second inclined holes 109 (5:5) are provided in the inner circumferential region since the inner circumferential region is easily affected by the plasma so that the electrode plate 160 is easily worn away. Accordingly, the lifespan of the electrode plate 160 may be extended.

Arrangement Example (2)

Arrangement Example Focusing on a Discharge Countermeasure

Like the above arrangement example (1), the arrangement example (2) also focuses on the discharge countermeasure. In the arrangement example (2), the first inclined holes 106 (7:3) are provided in the inner circumferential region, the second inclined holes 109 (5:5) are provided in the intermediate region, and the Y-shaped holes 107 or the second inclined holes 109 (5:5) are provided in the outer circumferential region.

In the arrangement example (2), the bent holes are provided in all of the regions, and thus, the abnormal discharge may be prevented throughout the entire plate surface of the electrode plate 160. In addition, the Y-shaped holes 107 or the second inclined holes 109 (5:5) are provided in the intermediate region and the outer circumferential region where the abnormal discharge is likely to generate, and thus, the abnormal discharge may be prevented. In addition, the first inclined holes 106 (7:3) that have a longer lifespan are provided in the inner circumferential region since the inner circumferential region is easily affected by the plasma so that the electrode plate 160 is easily worn away. Accordingly, the lifespan of the electrode plate 160 may be extended. When the arrangement example (2) is compared with the arrangement example (1), the arrangement example (2) is disadvantageous in view of the discharge countermeasure, but is advantageous in view of fabrication costs.

Arrangement Example (3)

Arrangement Example Considering Lifespan or Productivity

According to the arrangement example (3), the first inclined holes 106 (7:3) or the second inclined holes 109 (5:5) are provided in the inner circumferential region, the first inclined holes 106 (7:3) or the second inclined holes 109 (5:5) are provided in the intermediate region, and the second inclined holes 109 (5:5) are provided in the outer circumferential region. In the arrangement example (3), the bent holes are provided in all of the regions so that the abnormal discharge may be prevented throughout the entire plate surface of the electrode plate 160. In addition, the first inclined holes 106 (7:3) having a long lifespan are provided in the inner circumferential region, and thus, the lifespan of the electrode plate 160 may be extended. In addition, since the Y-shaped holes 107 are not provided in any of the regions, the fabrication costs may be less than those of the arrangement examples (1) and (2).

Arrangement Example (4)

Arrangement Example Considering Lifespan or Productivity

According to the arrangement example (4), the first inclined holes 106 (7:3) or the standard holes are provided in the inner circumferential region, and the first inclined holes 106 (7:3) are provided in the intermediate region and the outer circumferential region. In the arrangement example (4), the bent holes are provided in the intermediate and outer circumferential regions, and thus, the abnormal discharge may be prevented throughout the regions where the discharge is likely to generate. By providing the standard holes in the inner circumferential region where the discharge hardly generates, the productivity may be improved.

Arrangement Example (5)

Arrangement Example Considering Lifespan or Productivity

According to the arrangement example (5), the standard holes are provided in the inner circumferential region, the first inclined holes 106 (7:3) or the standard holes are provided in the intermediate region, and the first inclined holes 106 (7:3) are provided in the outer circumferential region. In the arrangement example (5), the bent holes are provided in the outer circumferential region (and the intermediate region), and thus, the abnormal discharge may be prevented throughout the region where the discharge is most likely to generate. In addition, by providing the standard holes in the inner circumferential region where the discharge hardly generates, the productivity may be improved.

As described above, the arrangement focusing on preventing the abnormal discharge throughout the region where the discharge is likely to generate and focusing on the amount of abrasion, the productivity, or the fabrication costs on the region where the discharge hardly generates is performed, and thus, the electrode plate 160 for the plasma etching, by which a balance between the prevention of the abnormal discharge and the lifespan, the productivity, and the fabrication costs of the electrode plate 160 may be maintained, may be fabricated.

The above described arrangement examples may be set as a rule as follows. That is, a first arrangement rule may be that the electrode plate is divided into two or more regions in a radial direction of the electrode plate so that the region where the Y-shaped holes 107 are provided is located on the outer circumferential side of the region where the inclined holes 106 and 109 are provided, and the region where the inclined holes 106 and 109 are provided is located on the outer circumferential side of the region where the standard holes are provided. In addition, based on the first arrangement rule, the gas holes of each type may be provided in each of the regions.

In addition, the arrangement examples may be set as an another rule as follows. That is, a second arrangement rule may be that the inclined holes include the first inclined holes 106 (7:3) and the second inclined holes 109 (5:5) having a smaller ratio of the length of the straight pore to the sloping pore than the first inclined holes 106 (7:3), and the region where the first inclined holes 106 are provided is located on the inner circumferential side of the region where the second inclined holes 109 are provided. In addition, based on the second arrangement rule, the gas holes of each type may be provided in each of the regions. However, the inclined holes are not limited to the first inclined holes 106 and the second inclined holes 109, and first inclined holes and second inclined holes having various ratios between the straight pore and the sloping pore may be provided. Also, in this case, an inclined hole having a greater ratio of the length of the straight pore to the sloping pore is provided on the inner circumferential side of the inclined hole having a smaller ratio of the length of the straight pore to the sloping pore.

After dividing the electrode plate into the three regions, that is, the inner circumferential side, the outer circumferential side, and the intermediate side, in the radial direction of the electrode plate, the gas holes suitable for the first and second arrangement rules from among the Y-shaped holes 107, the first inclined holes 106, the second inclined holes 109, and the standard holes may be provided as the gas holes on the inner circumferential side, the outer circumferential side, and the intermediate side.

As described above, the bent holes having various structures are optimally arranged according to the objectives, and thus, the abnormal discharge generating in the upper portion of the electrode plate 160 that functions as a gas shower head may be prevented. Accordingly, generation of particles and contamination of the wafer or inside of the process chamber 100 may be prevented, and processes may be stably performed, and at the same time, the lifespan of the electrode plate 160 may be extended. However, the bent holes require a machining process that is more complex than that of the standard holes, and thus, there may be a problem in relation to productivity. However, the electrode plate 160 may be stably produced by limiting the number of bent holes. In addition, according to the electrode plate 160 of the present embodiment, attachment of products generated due to a reaction and generation of particles may be prevented.

However, the types of gas holes provided in each of the two or more regions may be the same as each other. In addition, if the types of gas holes provided in the two of three regions are different from each other, the types of gas holes provided in two adjacent regions from among the three regions may be the same as each other. The same type of bent holes may be provided in all of the two or more regions. When the bent gas holes are provided in all of the regions, the abnormal discharge may be more prevented, the gas may be introduced evenly, and the fabrication costs may be reduced.

The electrode plate 160 for the plasma etching according to the above described present embodiment may be applied to a plasma etching apparatus 10 that includes the process chamber 100, the first and second electrodes facing each other in the process chamber 100 and having the plasma generating space U therebetween, and the gas supply source 115 supplying the gas into the process chamber 100, wherein the first electrode includes the electrode plate 160 formed as a disc shape having a predetermined thickness, the plurality of gas holes penetrating a surface of the electrode plate 160 perpendicularly are provided in the different circumferences of a plurality of concentric circles, and the gas holes of different types are provided in two or more regions into which the electrode plate 160 is divided in the radial direction of the electrode plate 160.

Here, the first electrode of the plasma etching apparatus 10 may be applied to the lower electrode 110, or may be applied to the upper electrode 105, more preferably.

According to the present invention, an abnormal discharge generating on a rear surface of an upper electrode may be prevented.

While this invention has been particularly shown and described with reference to exemplary embodiments thereof, it will be understood by those skilled in the art that various changes in form and details may be made therein without departing from the spirit and scope of the invention as defined by the appended claims.

For example, an electrode plate of the present invention may be used in the plasma etching; however, the present invention is not limited thereto. That is, the electrode plate of the present invention may be applied to plasma process apparatuses such as microwave plasma process apparatuses and inductively coupled plasma (ICP) process apparatuses.

What is claimed is:

1. An electrode plate for a plasma etching formed as a disc shape having a predetermined thickness, the electrode plate comprising: a plurality of gas holes through which a gas is able to be discharged, wherein the electrode plate is divided into at least three regions according to distances from a center of the electrode plate, shapes of the gas holes are different according to the regions, the at least three regions comprising an outermost region, an intermediate region and an innermost region, Y-shaped holes are provided in the outermost region, the Y-shaped holes each comprising: a straight pore penetrating one surface of the electrode plate perpendicularly to the one surface; a sloping pore communicating with the straight pore and penetrating other surface of the electrode plate non-perpendicularly to the other surface; and a trap pore branching from a connecting point between the straight pore and the sloping pore, first inclined holes are provided in the intermediate region, the first inclined holes each consisting of: the straight pore and the sloping pore, and second inclined holes or standard holes are provided in the innermost region, wherein a ratio of length of the straight pore of the second inclined hole to length of the sloping pore of the second inclined hole is larger than a ratio of length of the straight pore of the first inclined hole to length of the sloping pore of the first inclined hole, and each of the standard holes penetrates the electrode plate straight in a thicknesswise direction of the electrode plate.

2. A plasma etching apparatus comprising:

a process chamber;

a first electrode and a second electrode facing each other in the process chamber and having a plasma generating space between the first and second electrodes; and a gas supply source which supplies a gas into the process chamber, wherein the first electrode comprises the electrode plate of claim 1.

3. The electrode plate of claim 1, wherein the second inclined holes are provided in the innermost region, the intermediate region is divided into a plurality of regions according to distances from the center, each of the divided intermediate regions have inclined holes consisting of the straight pore and the sloping pore, and as going farther from the center, the inclined holes in the innermost region and the divided intermediate regions have shorter straight pore and longer slopping pore.

4. The electrode plate of claim 1, wherein the standard holes are provided in the innermost region, the intermediate region is divided into a plurality of regions according to distances from the center, each of the divided intermediate regions have inclined holes consisting of the straight pore and the sloping pore, and as going farther from the center, the inclined holes in the divided intermediate regions have shorter straight pore and longer slopping pore.

5. The electrode plate of claim 1, wherein the outermost region is a region including at least an outermost circumference of the electrode plate, and the innermost region is a region including at least the center of the electrode plate.

* * * * *